(12) United States Patent
Yun et al.

(10) Patent No.: US 7,928,783 B2
(45) Date of Patent: Apr. 19, 2011

(54) SEMICONDUCTOR INTEGRATED CIRCUIT

(75) Inventors: Won Joo Yun, Ichon-si (KR); Hyun Woo Lee, Ichon-si (KR); Ki Han Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 94 days.

(21) Appl. No.: 12/493,804

(22) Filed: Jun. 29, 2009

(65) Prior Publication Data

US 2010/0289542 A1 Nov. 18, 2010

(30) Foreign Application Priority Data

May 13, 2009 (KR) ........................ 10-2009-0041685

(51) Int. Cl.
*H03L 7/06* (2006.01)

(52) U.S. Cl. ........................................ 327/158; 327/149

(58) Field of Classification Search .................. 327/149, 327/158

See application file for complete search history.

(56) References Cited

U.S. PATENT DOCUMENTS

| | | | |
|---|---|---|---|
| 6,169,434 B1 | 1/2001 | Portmann | |
| 6,643,790 B1 | 11/2003 | Yu et al. | |
| 6,963,235 B2 * | 11/2005 | Lee | 327/158 |
| 7,061,288 B2 * | 6/2006 | Burgess | 327/156 |
| 7,155,190 B2 * | 12/2006 | Rathbun, Jr. | 455/260 |
| 7,315,217 B2 * | 1/2008 | Galloway et al. | 331/34 |
| 7,443,254 B2 * | 10/2008 | Gong | 331/111 |
| 7,466,173 B2 * | 12/2008 | Burgess | 327/148 |
| 7,479,834 B2 * | 1/2009 | Koukab et al. | 331/16 |
| 7,737,745 B2 * | 6/2010 | You | 327/158 |
| 7,821,350 B2 * | 10/2010 | Dai et al. | 331/179 |
| 2002/0079941 A1 | 6/2002 | Jung et al. | |
| 2003/0117194 A1 * | 6/2003 | Lee | 327/158 |
| 2005/0186929 A1 * | 8/2005 | Rathbun | 455/260 |
| 2006/0208805 A1 * | 9/2006 | Galloway et al. | 331/16 |
| 2007/0040617 A1 * | 2/2007 | Koukab et al. | 331/16 |
| 2009/0146706 A1 * | 6/2009 | You | 327/158 |

FOREIGN PATENT DOCUMENTS

| | | | |
|---|---|---|---|
| EP | 1564890 A1 * | 8/2005 | |
| JP | 55071328 A * | 5/1980 | |
| JP | 2001-308698 A | 11/2001 | |
| JP | 2006262489 A * | 9/2006 | |

OTHER PUBLICATIONS

Won-Joo Yun et al; "Coverage expandable current type code controlled DCC with TDC-based range selector", IEICE Electronics Express, vol. 6, No. 5, 205-210.

* cited by examiner

*Primary Examiner* — Lincoln Donovan
*Assistant Examiner* — Adam D Houston
(74) *Attorney, Agent, or Firm* — Ladas & Parry LLP

(57) ABSTRACT

A semiconductor integrated circuit includes a frequency determining unit configured to determine an operational speed of the semiconductor integrated circuit and to generate a frequency region signal; a duty cycle control unit configured to detect a duty cycle of a DLL clock and to generate a duty cycle control signal; a duty cycle correcting unit configured to generate a corrected clock by correcting a duty cycle of an input clock in response to the frequency region signal and in response to the duty cycle control signal; and a DLL (Delay Locked Loop) circuit configured to generate the DLL clock by controlling a phase of the corrected clock.

17 Claims, 5 Drawing Sheets

SEMICONDUCTOR INTEGRATED CIRCUIT

CROSS-REFERENCES TO RELATED PATENT APPLICATION

The present application claims priority under 35 U.S.C 119(a) to Korean Application No. 10-2009-0041685, filed on May 13, 2009, in the Korean Intellectual Property Office, the disclosure of which is incorporated herein by reference in its entirety as set forth in full.

BACKGROUND

1. Technical Field

The present invention relates to a semiconductor integrated circuit, more particularly, a circuit that corrects the duty cycle of a clock in a semiconductor integrated circuit.

2. Related Art

In general, semiconductor integrated circuits, such as an SDRAM (Synchronous Dynamic Random Access Memory), exhibit improved operational speeds by using a clock in the operation. For this purpose, semiconductor integrated circuits are provided with a clock buffer and use a clock inputted from the outside after buffering it. Although in some cases, semiconductor integrated circuits generate and use an internal clock by themselves, of which the phase difference from an output clock is corrected by a DLL (Delay Locked Loop) circuit or a PLL (Phase Locked Loop) circuit. In a clock used internally in the semiconductor integrated circuits, it is preferable that the ratio of the high period and a low period, that is, the duty ratio is maintained at 50:50. However, a large number of delay elements are provided inside the semiconductor integrated circuits. As a result, the duty ratio of the clock inside is frequently distorted.

As the operational speed of semiconductor integrated circuits increases, the frequency use of a clock gradually increases. As a result, a clock that exhibits a more stable duty ratio is desirable. Accordingly, a semiconductor integrated circuit is provided with a duty cycle correcting circuit therein for stabilizing the duty ratio of a clock and the duty cycle correcting circuit becomes more and more important to stably use a clock in a high-speed operation. The duty cycle correcting circuit falls into an analog type and a digital type. The analog type duty cycle correcting circuit provides an advantage in that it can implement linear control, but suffers a disadvantage in that the region of an operation frequency is limited. On the other hand, the digital type duty cycle correcting circuit can realize an advantage in that the region of an operation frequency is large, but can suffer a disadvantage in that it has difficulty in implementing linear control. As described above, the conventional duty cycle correcting circuits have a technical limit in that they cannot be implemented to enjoy both the advantages realized by analog and digital types. Therefore, it has been continuously required to overcome the technical limit.

SUMMARY

The present invention provides a semiconductor integrated circuit that can control an operation of linearly correcting a duty cycle of a clock while having a wide frequency region.

In one embodiment, a semiconductor integrated circuit includes: a frequency determining unit configured to determine an operational speed of the semiconductor integrated circuit and to generate a frequency region signal; a duty cycle control unit configured to detect a duty cycle of a DLL clock and to generate a duty cycle control signal; a duty cycle correcting unit configured to generate a corrected clock by correcting a duty cycle of an input clock in response to the frequency region signal and in response to the duty cycle control signal; and a DLL (Delay Locked Loop) circuit configured to generate the DLL clock by controlling a phase of the corrected clock.

In another embodiment, a semiconductor integrated circuit includes: a frequency determining unit configured to generate a frequency region signal by determining a frequency of an input clock; a duty cycle control unit, in response to the logic value of the multiple-bit digital signal, configured to generate a multiple-bit digital signal by detecting a duty cycle of a DLL clock, and configured to generate a first bias current having a variable current and configured to generate a second bias current having a substantially fixed current; a duty cycle correcting unit configured to operate in a frequency region corresponding to the frequency region signal, configured to adjust the voltage levels of a first node and a second node in accordance to the amount of current of the first bias current and the amount of current of the second bias current, and configured to generate a corrected clock by correcting a duty cycle of the input clock in accordance to the voltage levels of the first node and the second node; and a DLL (Delay Locked Loop) circuit configured to generate the DLL clock by controlling a phase of the corrected clock.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Preferred embodiments are described hereafter in detail with reference to the accompanying drawings.

Figure 1:
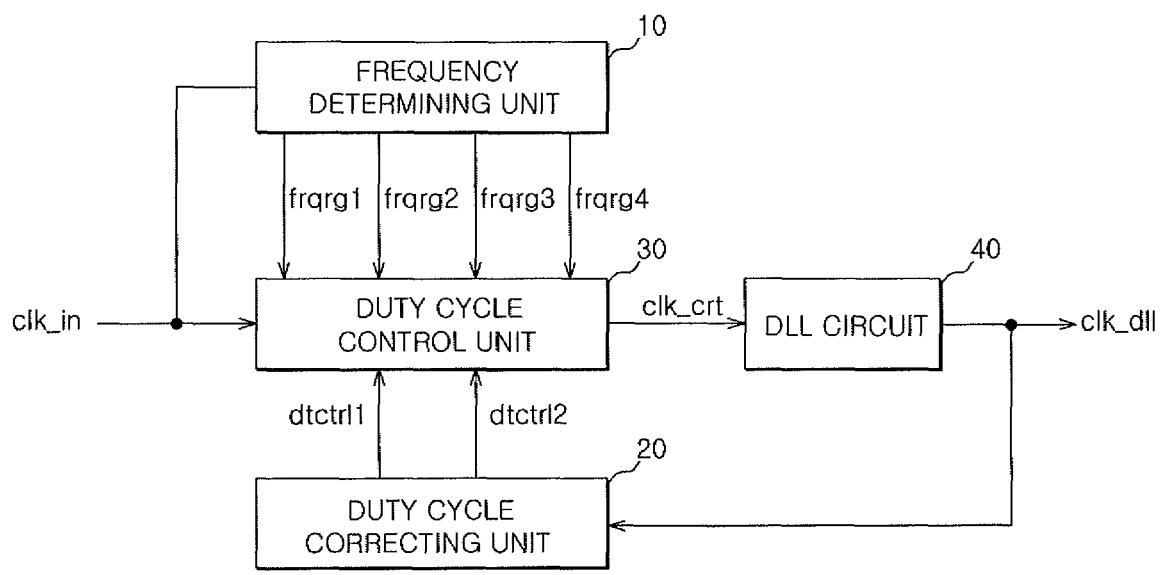
FIG. 1 is a block diagram illustrating a configuration of a semiconductor integrated circuit according to an embodiment.

FIG. 1 is a block diagram illustrating a configuration of a semiconductor integrated circuit according to an embodiment.

As shown in FIG. 1, the semiconductor integrated circuit can include a frequency determining unit 10, a duty cycle control unit 20, a duty cycle correcting unit 30, and a DLL (Delay Locked Loop) circuit 40.

The frequency determining unit 10 determines a frequency of an input clock 'clk_in' and generates first to fourth frequency region signals 'frqrg1' to 'frqrg4'. The input clock 'clk_in' can be implemented as a pair of clocks, but is a clock with a single phase herein. The frequency determining unit 10 performs an operation of enabling any one of the plurality of frequency region signals 'frqrg1' to 'frqrg4' corresponding to a plurality of predetermined frequency regions. Although the number of frequency region signals 'frqrg' is depicted as four herein, the frequency determining unit 10 can be configured to have any number of frequency region signals 'frqrg' by setting the number of frequency regions to generate two, three, five, or even more frequency region signals.

The duty cycle control unit 20 detects a duty cycle of a DLL clock 'clk_dll' and generates first and second duty cycle control signals 'dtctrl1', 'dtctrl2'. For this purpose, the duty cycle control unit 20 detects the duty cycle of the DLL clock 'clk_dll', generates a multiple-bit digital signal corresponding to the result, and generates first and second bias currents in response to the multiple-bit digital signal. Further, the duty cycle control unit 20 outputs the first and second bias currents as the first and second duty cycle control signals 'dtctrl1', 'dtctrl2', respectively. That is, the duty cycle control unit 20 acquires information of the duty cycle of the DLL clock 'clk_dll' as the digital signal, converts the information into an analog control signal, and transmits the analog control signal to the duty cycle correcting unit 30. Although it is exemplified when the DLL clock 'clk_dll' is inputted to the duty cycle control unit 20 herein, it should be understood that the scope of the present invention includes a configuration when the correcting clock 'clk_crt' is inputted, instead of the DLL clock 'clk_dll'.

The duty cycle correcting unit 30 generates a corrected clock 'clk_crt' by correcting the duty cycle of the input clock 'clk_in' in response to the first to fourth frequency region signals 'frqrg1' to 'frqrg4' and in response to the duty cycle control signals 'dtctrl1', 'dtctrl2'. The duty cycle correcting unit 30 operates in the frequency region corresponding to anyone of the frequency region signals, which is correspondingly enabled, of the first to fourth frequency region signals 'frqrg1' to 'frqrg4'. Further, the duty cycle correcting unit 30 is configured to perform an operation of correcting the duty cycle of the input clock 'clk_in' in response to the first and second duty cycle control signals 'dtctrl1', 'dtctrl2' that are transmitted as the bias currents, and configured to output the corrected clock 'clk_crt' as a result of the operation.

The DLL circuit 40 generates the DLL clock 'clk_dll' by controlling a phase of the corrected clock 'clk_crt'. The DLL circuit 40 is a circuit for generally correcting the delay amount of a clock that is delayed by a clock buffer and delayed by a transmission line of a clock. The DLL circuit 40 receives the corrected clock 'clk_crt' and generates the DLL clock 'clk_dll' which has a phase earlier than the corrected clock 'clk_crt', in which the DLL clock 'clk_dll' can be implemented as a pair of clocks.

As described above, the semiconductor integrated circuit according to an embodiment includes the frequency determining unit 10 and sets four frequency regions, and then enables one of the four frequency region signals 'frqrg1' to 'frqrg4' as a function of the frequency of the input clock 'clk_in'. Accordingly, the duty cycle correcting unit 30 operates in the region corresponding to the frequency of the input clock 'clk_in'.

Further, the duty cycle control unit 20 is configured to detect the duty cycle of the DLL clock 'clk_dll' outputted from the DLL circuit 40, and configured to acquire information of the duty cycle of the DLL clock 'clk_dll' as a digital code. Further, the duty cycle control unit 20 is configured to generate bias currents by using the acquired digital code and configured to transmit the bias currents to the duty cycle correcting unit 30 as the first and second duty cycle control signals 'dtctrl1', 'dtctrl2'. The duty cycle correcting unit 30 is configured to adjust the ratio of the high period and the low period of the corrected clock 'clk_crt' in response to the amount of current of the first and second duty cycle control signals 'dtctrl1', 'dtctrl2'.

As described above, since the semiconductor integrated circuit performs the operation of correcting the duty cycle of the clock by using the bias currents, it can provide the advantage of the operation of correcting the duty cycle of an analog type. Further, since the semiconductor integrated circuit can operate in a larger frequency region, it is possible to overcome many of the disadvantages of the operation of correcting the duty cycle of the analog type. As a result, by implementing the embodiment, it is possible to realize a more efficiently performance operation of correcting the duty cycle.

Figure 2:
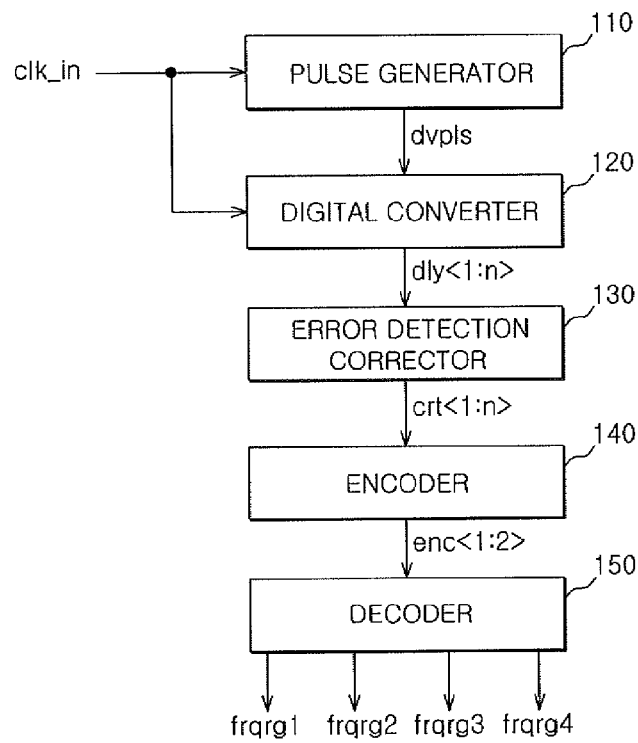
FIG. 2 is a diagram illustrating a configuration of the frequency determining unit shown in FIG. 1.

FIG. 2 is a diagram illustrating a configuration of the frequency determining unit shown in FIG. 1.

As shown in FIG. 2, the frequency determining unit 10 can include a pulse generator 110, a digital converter 120, an error detection corrector 130, an encoder 140, and a decoder 150.

The pulse generator 110 divides the frequency of the input clock 'clk_in' by two, and then generates a divided pulse signal 'dvpls' using the frequency-divided clock. It is important to note that the input clock 'clk_in' can be implemented as a pair of clocks, but in this exemplary embodiment the input clock 'clk_in' is simply implemented as a single phase clock herein. The pulse generator 110 is configured to divide the frequency of the input clock 'clk_in' by two and output only one cycle of the divided clock. Accordingly, the divided pulse signal 'dvpls' is implemented as a pulse signal having a pulse width corresponding to one cycle of the input clock 'clk_in'. The configuration of the pulse generator 100 operating as described above corresponds to a technical configuration that can be easily implemented by those skilled in the art.

The digital converter 120 sequentially delays the divided pulse signal 'dvpls' and generates an n-bit delay code 'dly<1:n>' by comparing phases of the delayed signals with the input clock 'clk_in'. The digital converter 120 can be implemented by using a typical time-to-digital converter. That is, though not shown, the digital converter 120 has a plurality of delayers connected in a series therein and a plurality of phase comparators that compares the phases of the signals delayed by the delayers and the input clock 'clk_in', such that it generates the n-bit delay code 'dly<1:n>'. As a result, the n-bit delay code 'dly<1:n>' provides cycle information of the input clock 'clk_in'. Preferably, the cycle information of the input clock 'clk_in' is expressed according to how many bits having a logic value of 1 continuously exist from the lowest bit in the n-bit delay code 'dly<1:n>'.

The error detection corrector 130 generates an n-bit correction code 'crt<1:n>' by performing error detection and correction operations for the n-bit delay code 'dly<1:n>'. It is preferable that the n-bit delay code 'dly<1:n>' include bits having a logic value of 0 continuously from the highest bit and bits having a logic value of 1 continuously from the lowest bit. However, any one of the bits having a logic value of 1 can have a logic value of 0 due to a noise. The error detection corrector 130 is provided to correct this malfunction and can be implemented by a typical bubble error corrector. For example, the error detection corrector 130 extracts a point where the logic value of the n-bit delay code 'dly<1:n>' is (0, 0, 1), and can recognize the point as an interface point of the continuous value of 0 and the continuous value of 1. The error detection corrector 130 re-configures an n-bit code value by disposing bits having a logic value 0 continuously from the highest bit and bits having a logic value of 1 continuously from the lowest bit, on the basis of the point extracted by the above operation, thereby generating the n-bit correction code 'crt<1:n>'.

The encoder 140 generates a two-bit encoding signal 'enc<1:2>' by encoding the n-bit correction code 'crt<1:n>'.

The two-bit encoding signal 'enc<1:2>' outputted from the encoder 140 has a logic value which depends on that the logic value of the n-bit correction code 'crt<1:n>' pertains to which range of predetermined ranges. That is, for example, when the n-bit is four bits, a 4-bit correction code 'crt<1:4>' can have logic values from 0 to 15, and the 2-bit encoding signal 'enc<1:2>' divides the logic values from 0 to 15 into four regions and has a logic value corresponding to the region to which the logic value of the present correction code 'crt<1:4>' pertains.

The decoder 150 generates the first to fourth frequency region signals 'frqrg1' to 'frqrg4' by decoding the 2-bit encoding signal 'enc<1:2>'. The decoder 150 enables only one of the first to fourth frequency region signals 'frqrg1' to 'frqrg4', and it is expressed that the frequency of the input clock 'clk_in' pertains to which frequency region of the predetermined divided frequency regions, according to which signal is enabled.

Figure 3:
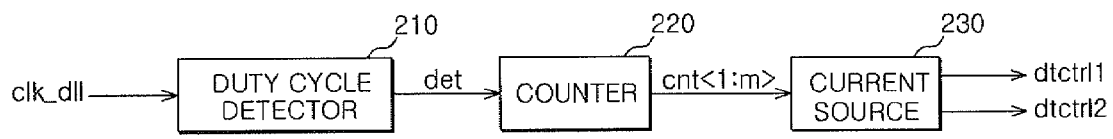
FIG. 3 is a diagram illustrating a configuration of the duty cycle control unit shown in FIG. 1.

FIG. 3 is a diagram illustrating a duty cycle control unit shown in FIG. 1.

As shown in FIG. 3, the duty cycle control unit 20 can include a duty cycle detector 210, a counter 220, and a current source 230.

The duty cycle detector 210 detects the duty cycle of the DLL clock 'clk_dll' and generates a detection signal 'det'. The duty cycle detector 210 can be implemented by using a typical duty accumulator. That is, the duty cycle detector 210 makes the detection signal 'det' to have a voltage set at a high level when the high period of the DLL clock 'clk_dll' is smaller than the low period. Likewise, the duty cycle detector 210 makes the detection signal 'det' to have a voltage set at a low level when the high period of the DLL clock 'clk_dll' is larger than the low period.

The counter 220 generates an m-bit counting signal 'cnt<1:m>' by performing a counting operation in response to the detecting signal 'det'. The counter 220 is implemented as an up/down counter and performs the counting operation in response to the voltage level of the detection signal 'det'. That is, the counter 220 increases the logic value of the m-bit counting signal 'cnt<1:m>' by performing an up-counting operation when the voltage level of the detection signal 'det' is a high level, and likewise decreases the logic value of the m-bit counting signal 'cnt<1:m>' by performing a down-counting operation when the voltage level of the detection signal 'det' is a low level.

The current source 230 generates the first and second bias currents in response to the m-bit counting signal 'cnt<1:m>' and outputs the bias currents as the first and second duty cycle control signals 'dtctrl1', 'dtctrl2'. The current source 230 increases the amount of current of the first duty cycle control signal 'dtctrl1' and decreases the amount of current of the second duty cycle control signal 'dtctrl2', when the logic value of the m-bit counting signal 'cnt<1:m>' increases. On the contrary, when the logic value of the m-bit counting signal 'cnt<1:m>' decreases, the current source 230 decreases the amount of current of the first duty cycle control signal 'dtctrl1' and increases the amount of current of the second duty cycle control signal 'dtctrl2'.

As a result, the duty cycle control unit 20 decreases the amount of current of the first duty cycle control signal 'dtctrl1' and increases the amount of current of the second duty cycle control signal 'dtctrl2', when it is detected that the high period of the DLL clock 'clk_dll' is larger than the low period. On the contrary, the duty cycle control unit 20 increases of the amount of current of the first duty cycle control signal 'dtctrl1' and decreases the amount of current of the second duty cycle control signal 'dtctrl2', when it is detected that the high period of the DLL clock 'clk_dll' is smaller than the low period. As described above, the duty cycle control unit 20 has a characteristic in the configuration that it acquires the detection result of the duty cycle of the DLL clock 'clk_dll' as digital information and correspondingly outputs a bias current that is an analog signal.

Figure 4:
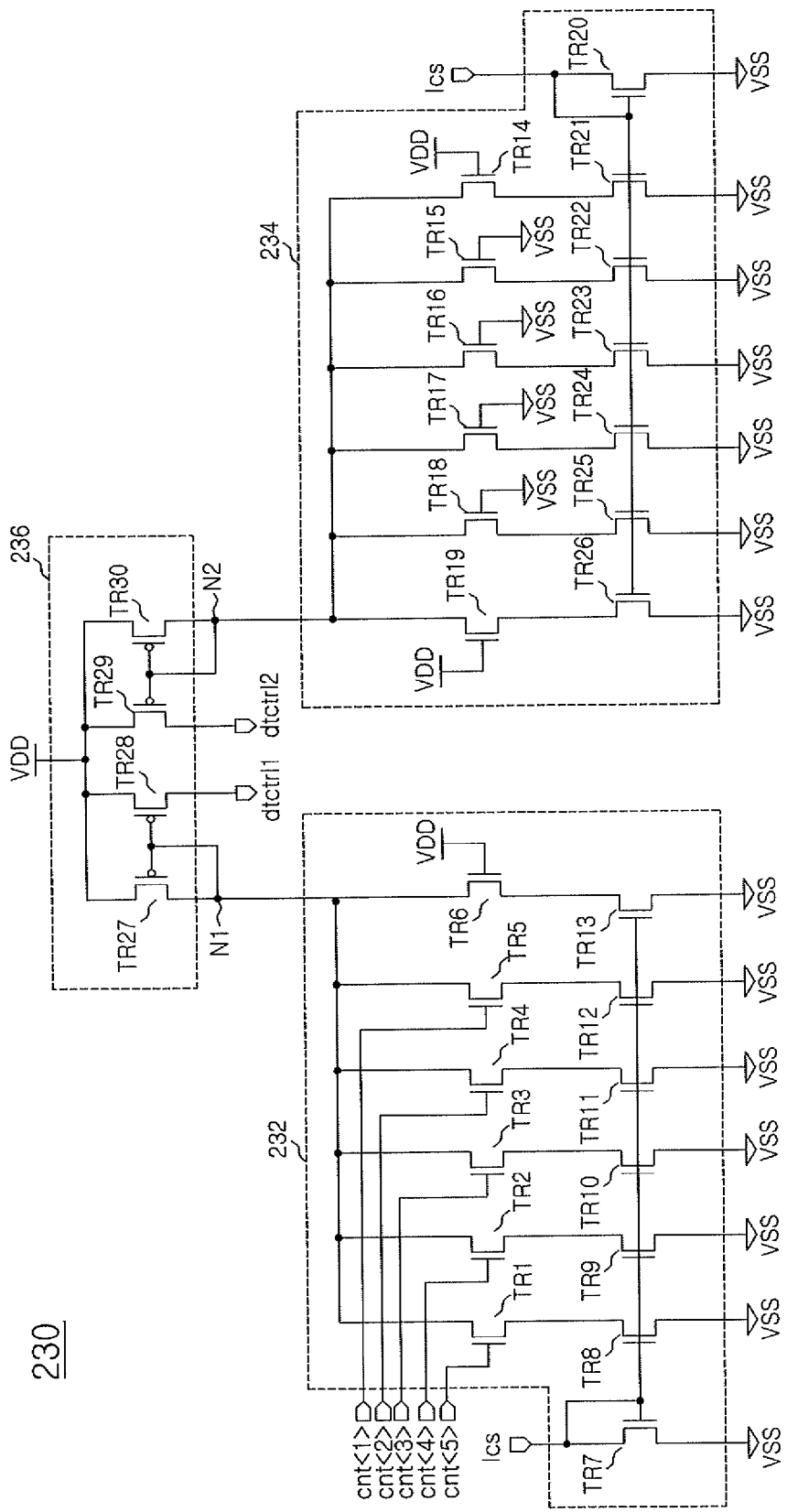
FIG. 4 is a diagram illustrating a configuration of the current source shown in FIG. 3.

FIG. 4 is a diagram illustrating a configuration of the current source shown in FIG. 3, in which it is exemplified when the total number of bits of the m-bit counting signal 'cnt<1:m>' is five bits.

As shown in FIG. 4, the current source 230 can include a first node 'N1', a second node 'N2', a first current controller 232, a second current controller 234, and an current generator 236.

The first current controller 232 controls the amount of current of the first node 'N1' in response to a supply current 'Ics' and the 5-bit counting signal 'cnt<1:5>'. The first current controller 232 includes first to thirteenth transistors 'TR1' to 'TR13'.

Each of the first to fifth transistors 'TR1' to 'TR5' includes a gate that receives a bit of the 5-bit counting signal 'cnt<1:5>', respectively, and a drain that is connected to the first node 'N1'. The sixth transistor 'TR6' includes a gate where an external supply voltage 'VDD' is applied and a drain that is connected to the first node 'N1'. The seventh transistor 'TR7' includes a gate and a drain where the supply current 'Ics' is supplied, and a grounded source. The eighth to thirteenth transistors 'TR8' to 'TR13' include gates where the supply current 'Ics' is supplied, drains that are connected to sources of the first to sixth transistors 'TR1' to 'TR6', respectively, and grounded sources.

The second current controller 234 controls the amount of current of the second node 'N2' in response to the supply current 'Ics'. The second current controller 234 is connected to the second node 'N2' and includes fourteenth to twenty-sixth transistors 'TR14' to 'TR26'. The second current controller 234 is configured similarly and symmetrically to the first current controller 232. The fourteenth to eighteenth transistors 'TR14' to 'TR18' of the second current controller 234 are controlled by a fixed digital code of (1, 0, 0, 0, 0), instead of the 5-bit counting signal 'cnt<1:5>'.

The current generator 236 controls the amount of current of the first duty cycle control signal 'dtctrl1' and the second duty cycle control signal 'dtctrl2' according to the amount of current of the first node 'N1' and the second node 'N2'. The current generator 236 includes the twenty-seventh to the thirtieth transistors 'TR27' to 'TR30'.

The twenty-seventh transistor 'TR27' includes a gate and a drain that are connected to the first node 'N1' and a source where the external supply voltage 'VDD' is applied. The twenty-eighth transistor 'TR28' includes a gate that is connected to the first node 'N1' and a source where the external supply voltage 'VDD' is applied, and outputs the first duty cycle control signal 'dtctrl1' through the drain of the twenty-eighth transistor 'TR28'. The twenty-ninth transistor 'TR29' includes a gate and a drain that are connected to the second node 'N2' and a source where the external supply voltage 'VDD' is applied. The thirtieth transistor 'TR30' includes a gate that is connected to the second node 'N2' and a source where the external supply voltage 'VDD' is applied, and outputs the second duty cycle control signal 'dtctrl2' through the drain.

In this configuration, the supply current 'Ics' is an current that is generated by an current generating circuit that is generally provided to supply a fixed current source to each circuit configuration in the semiconductor integrated circuit.

Meanwhile, the eighth to thirteenth transistors 'TR8' to 'TR13' included in the first current controller 232 have different sizes, in which it is preferable that each transistor from the thirteenth transistor 'TR13' to the eighth transistor 'TR8' is double the size of the previous transistor. That is, the eighth transistor 'TR8' has a size thirty-two times the size of the thirteenth transistor 'TR13'.

Similarly, the twenty-first to twenty-sixth transistors 'TR21' to 'TR26' included in the second current controller 234 have different sizes, in which it is preferable that each transistor from the twenty-sixth transistor 'TR26' to the twenty-first transistor 'TR21' is double the size of the previous transistor. In this configuration, the twenty-first transistor 'TR21' has a size thirty-two times the size of the twenty-sixth transistor 'TR26'.

According to the above configuration, the second current controller 234 generates a uniform current from the second node 'N2' and the first current controller 232 generates a variable current from the first node 'N1'. That is, the first current controller 232 turns on or off the first to fifth transistors 'TR1' to 'TR5' in accordance to the logic value of the 5-bit counting signal 'cnt<1:5>', and the voltage of the first node 'N1' correspondingly changes. In this embodiment, the higher the logic value of the 5-bit counting signal 'cnt<1:5>', the more the amount of current passing through the first to fifth transistors 'TR1' to 'TR5' increases and as a result the voltage of the first node 'N1' drops correspondingly. As described above, as the voltage of the first node 'N1' drops, the amount of current passing through the twenty-eighth transistor 'TR28' of the current generator 236 increases, so that the amount of current of the first duty cycle control signal 'dtctrl1' and that of the second duty control signal 'dtctrl2' both decrease.

On the contrary, in the first current controller 232, as the logic value of the 5-bit counting signal 'cnt<1:5>' become decreases, then the amount of current passing through the first to fifth transistors 'TR1' to 'TR5' increases and the voltage of the first node 'N1' increases. Further, as the voltage of the first node 'N1' increases, then the amount of current passing through the twenty-eighth transistor 'TR28' of the current generator 236 decreases, so that the amount of current of the first duty cycle control signal 'dtctrl1' and the second duty cycle control signal 'dtctrl2' decrease.

Figure 5:
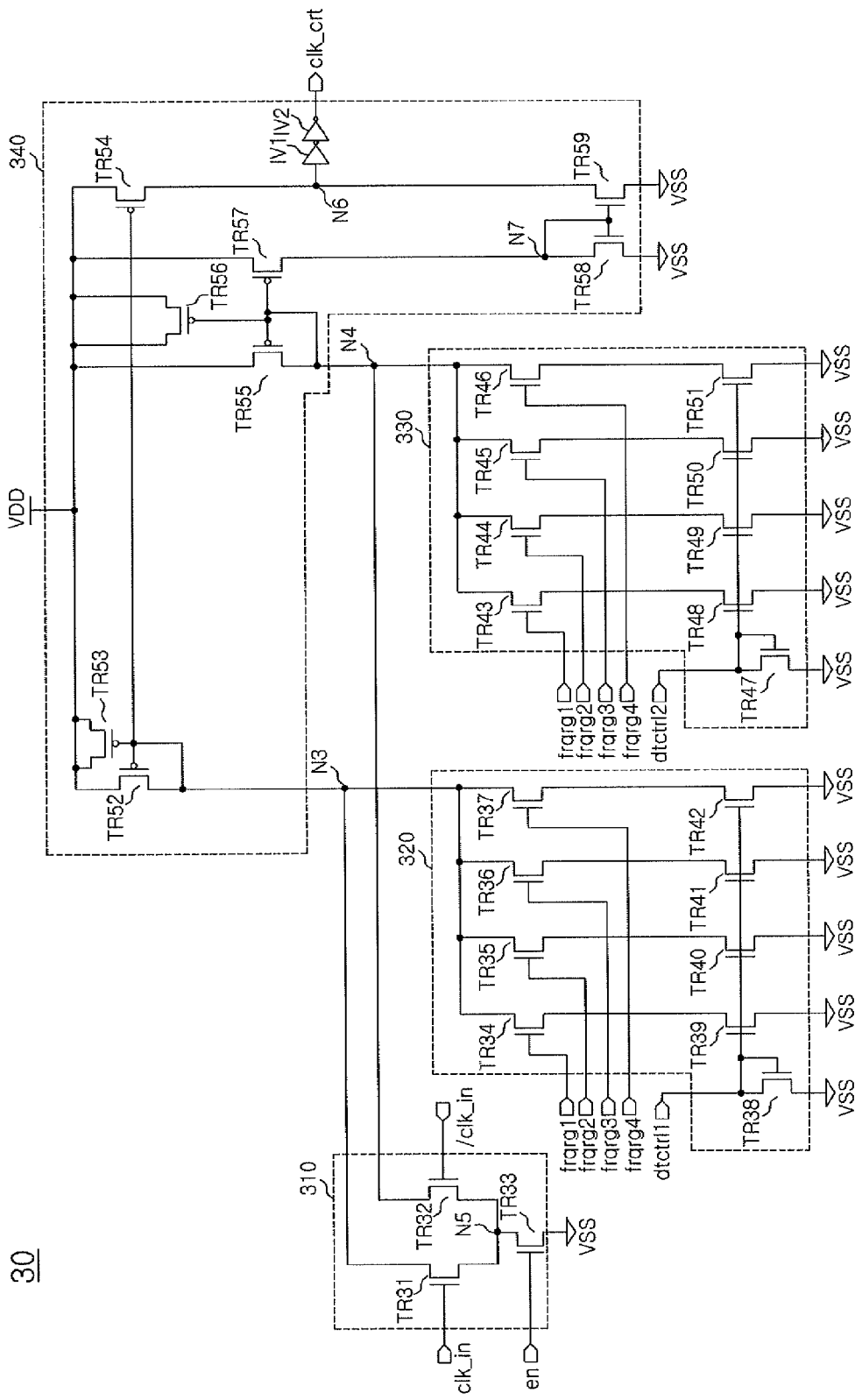
FIG. 5 is a diagram illustrating a configuration of the duty cycle correcting unit shown in FIG. 1.

FIG. 5 is a diagram illustrating a configuration of the duty cycle correcting unit shown in FIG. 1, in which it is exemplified when the input clock 'clk_in' is implemented as a pair of clocks 'clk_in', '/clk_in'.

As shown in FIG. 5, the duty cycle correcting unit 30 can include a third node 'N3', a fourth node 'N4', a clock input section 310, a first voltage controller 320, a second voltage controller 330, and a corrected clock generator 340.

The clock input section 310 controls the voltage of the third node 'N3' and the voltage of the fourth node 'N4' in response to the pair of input clocks 'clk_in', '/clk_in'. The clock input section 310 includes a thirty-first transistor to thirty-third transistor 'TR31' to 'TR33'.

The thirty-first transistor 'TR31' includes a gate that receives the positive input clock 'clk_in', a drain that is connected to the third node 'N3', and a source that is connected to a fifth node 'N5'. The thirty-second transistor 'TR32' includes a gate that receives the negative input clock '/clk_in', a drain that is connected to the fourth node 'N4', and a source that is connected to the fifth node 'N5'. The thirty-third transistor 'TR33' includes a gate where an enable signal 'en' is inputted, a drain that is connected to the fifth node 'N5', and a grounded source.

The first voltage controller 320 controls the voltage of the third node 'N3', in accordance to the first to fourth frequency region signals 'frqrg1' to 'frqrg4' and in accordance to the first duty cycle control signal 'dtctrl1'. The first voltage controller 320 includes thirty-fourth transistor 'TR34' to the forty-second transistor 'TR34' to 'TR42'.

The thirty-fourth transistor to the thirty-seventh transistor 'TR34' to 'TR37' include gates that receive the first to fourth frequency region signals 'frqrg1' to 'frqrg4', respectively, and drains that are connected to the third node 'N3'. The thirty-eighth transistor 'TR38' includes a gate and a drain where the first duty cycle control signal 'dtctrl1' is supplied and a grounded source. The thirty-ninth to forty-second transistors 'TR39' to 'TR42' include gates where the first duty cycle control signal 'detctrl1' is supplied, drains that are connected to the source ends of the thirty-fourth to thirty-seventh transistors 'TR34' to 'TR37', and grounded sources.

The second voltage controller 330 controls the voltage of the fourth node 'N4', in according to the first to fourth frequency region signals 'frqrg1' to 'frqrg4' and in according to the second duty cycle control signal 'dtctrl2'. The second voltage controller 330 includes forty-third to fifty-first transistors 'TR43' to 'TR51' and is configured in a similar manner as that of the first voltage controller 320. However, the second cycle control signal 'dtctrl2' is supplied to the common node of the gate and the drain of the forty-seventh transistor 'TR47' of the second voltage controller 330 and to the gates of the forty-eighth to fifty-first transistors 'TR48' to 'TR51'.

The corrected clock generator 340 generates the corrected clock 'clk_crt' in response to the voltage levels of the third node 'N3' and to the fourth node 'N4'. The corrected clock generator 340 includes fifty-second to the fifty-ninth transistors 'TR52' to 'TR59' and first and second inverters 'IV1' to 'IV2'.

The fifty-second transistor 'TR52' includes a gate and a drain that are connected to the third node 'N3' and a source where the external supply voltage 'VDD' is applied. The fifty-third transistor 'TR53' includes a gate that is connected to the third node 'N3', and a drain and a source where the external supply voltage 'VDD' is applied. The fifty-fourth transistor 'TR54' includes a gate that is connected to the third node 'N3', a source where the external supply voltage 'VDD' is applied, and a drain that is connected to a sixth node 'N6'. The fifty-fifth transistor 'TR55' includes a gate and a drain that are connected to the fourth node 'N4' and a source where the external supply voltage 'VDD' is applied. The fifty-sixth transistor 'TR56' includes a gate that is connected to the fourth node 'N4', and a source and a drain where the external supply voltage 'VDD' is supplied. The fifty-seventh transistor 'TR57' includes a gate that is connected to the fourth node 'N4', a source where the external supply voltage 'VDD' is applied, and a drain that is connected to a seventh node 'N7'. The fifty-eighth transistor 'TR58' includes a gate and a drain that are connected to a seventh node 'N7' and includes a grounded source. The fifty-ninth transistor 'TR59' includes a gate that is connected to the seventh node 'N7', and a drain connected to the sixth node 'N6' and includes a grounded source. The first inverter 'IV1' reverses and drives the voltage that is generated at the sixth node 'N6'. The second inverter 'IV2' outputs the corrected clock 'clk_crt' by reversing and driving the output signal of the first inverter 'IV1'.

In this configuration, the thirty-ninth to forty-second transistors 'TR39' to 'TR42' of the first voltage controller 320 are implemented in different sizes. Assuming that the first frequency region signal 'frqrg1' indicates the lowest frequency region and the fourth frequency region signal 'frqrg4' indicates the highest frequency region, it is preferable that the thirty-ninth transistor 'TR39' has the largest size and the forty-second transistor 'TR42' has the smallest size. Similarly, the forty-eighth to fifty-first transistors 'TR48' to 'TR51' of the second voltage controller 330 are also implemented in different sizes, in which it is preferable that the forty-eighth transistor 'TR48' has the largest size and the fifty-first transistor 'TR51' has the smallest size.

With this configuration, when the duty cycle correcting unit 30 operates in the highest frequency region, the forty-second transistor 'TR42' having the smallest size in the first voltage controller 320 and the fifty-first transistor 'TR51' having the smallest size in the second voltage controller 330 are turned on, such that the voltage of the third node 'N3' and the voltage of the fourth node 'N4' can oscillate within a narrow width. On the contrary, when the duty cycle correcting unit 30 operates in the slower frequency region, the thirty-ninth transistor 'TR39' having the largest size in the first voltage controller 320 and the forty-seventh transistor 'TR47' having the largest size in the second voltage controller 330 are turned on, such that the voltage of the third node 'N3' and the fourth node 'N4' can oscillate within a large width.

The voltage of the third node 'N3' and the fourth node 'N4' is basically controlled according to the voltage of the pair of input clock 'clk_in', '/clk_in' inputted to the clock input section 310 and is complementarily toggled. The voltage of the third node 'N3' and the fourth node 'N4' is also controlled by the amount of current of the first and second duty cycle control signals 'dtctrl1', 'dtctrl2'. That is, the larger the current of the first duty cycle control signal 'dtctrl1' and the smaller current of the second duty cycle control signal 'dtctrl2', then the lower the voltage of the third node 'N3' and the higher the voltage of the fourth node 'N4'. On the contrary, the smaller current of the first duty cycle control signal 'dtctrl1' and the larger the current of the second duty cycle control signal 'dtctrl2', then the higher the voltage of the third node 'N3' and the lower the voltage of the fourth node 'N4'.

When the high period of the positive input clock 'clk_in' is smaller than the low period, the amount of current of the first duty cycle control signal 'dtctrl1' increases, such that voltage having a long low level period is applied to the third node 'N3'. Accordingly, the period where the fifty-fourth transistor 'TR54' of the corrected clock generator 340 increases and the high period of the voltage of the sixth node 'N6' increases, and as a result, the high period of the corrected clock 'clk_crt' increases.

On the contrary, when the high period of the positive input clock 'clk_in' is larger than the low period, the amount of current of the second duty cycle control signal 'dtctrl2' increases, such that voltage having a long low level period is applied to the fourth node 'N4'. Accordingly, the turn-on periods of the fifty-seventh transistor 'TR57' and the fifty-ninth transistor 'TR59' of the corrected clock generator 340 increase, and as a result, the low period of the corrected clock 'clk_crt' increases.

As described above, in a semiconductor integrated circuit of an embodiment, the high period of the DLL clock 'clk_dll' is outputted to be larger than the low period, the detection signal 'det' has a low-level period and the logic value of the 5-bit counting signal 'cnt<1:5>' is decreased. Accordingly, the amount of current of the first duty cycle control signal 'dtctrl1' decreases and the amount of current of the second duty cycle control signal 'dtctrl2' increases. Further, as the amount of current of the second duty cycle control signal 'dtctrl2' increases, an operation of increasing the low period of the corrected clock 'clk_crt' is repeatedly performed.

On the contrary, when the high period of the DLL clock 'clk_dll' is outputted to be smaller than the low period, the detection signal 'det' has high-level voltage and the logic value of the 5-bit counting signal 'cnt<1:5>' is increased. Accordingly, the amount of current of the first duty cycle control signal 'dtctrl1' increases and the amount of current of the second duty cycle control signal 'dtctrl2' decreases. Further, as the amount of current of the first duty cycle control signal 'dtctrl1' increases, an operation of increasing the high period of the corrected clock 'clk_crt' is repeatedly performed.

The important point in this configuration is that the operation frequency region of the duty cycle correcting unit 30 is defined by the first to fourth frequency region signals 'frqrg1' to 'frqrg4' transmitted from the frequency determining unit 10. The frequency determining unit 10 determines the frequency of the input clock 'clk_in' and enables any one of the first to fourth frequency region signals 'frqrg1' to 'frqrg4', and enables the duty cycle correcting unit 30 to operate in the frequency region corresponding to the enabled frequency region signal. Therefore, when operating the operation of correcting the duty cycle, the semiconductor integrated circuit can increase the linearity of the operation frequency range by using an analog type operation and by selecting any one of the plurality of frequency regions and subsequently operating in the frequency region.

Figure 6:
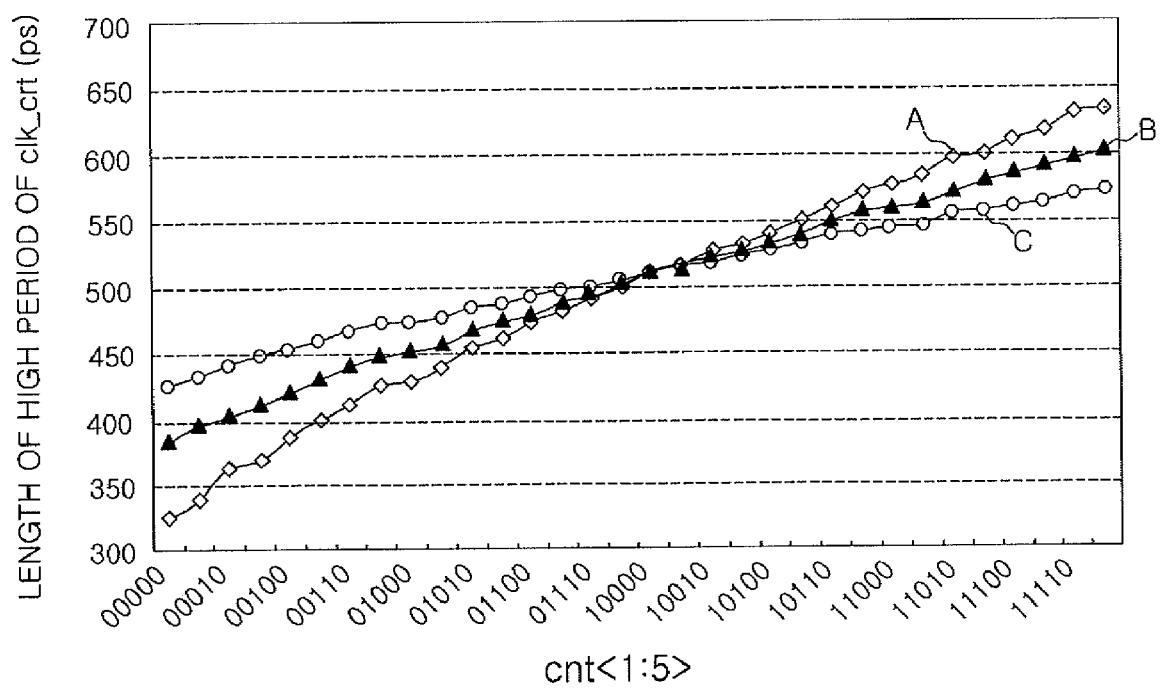
FIG. 6 is a graph illustrating the clock duty cycle correcting operation of a semiconductor integrated circuit according to an embodiment.

FIG. 6 is a graph illustrating an operation of correcting the clock duty cycle of a semiconductor integrated circuit according to an embodiment, in which it is exemplified when three operation frequency regions are set.

In FIG. 6, the horizontal axis shows changes in a logic value of the 5-bit counting signal 'cnt<1:5>' and the vertical axis shows changes in a length of the high period of the corrected clock 'clk_crt' in a picosecond unit 'ps'. The line indicated by 'A' shows changes of the length of the high period to changes of the logic value of the 5-bit counting signal 'cnt<1:5>' of the corrected clock 'clk_crt' in the lowest frequency region. The line indicated by 'C' shows changes of the length of the high period to changes of the logic value of the 5-bit counting signal 'cnt<1:5>' of the corrected clock 'clk_crt' in the highest frequency region. Analyzing the changes in the lines indicated by 'A', 'B', and 'C', it can be seen that the semiconductor integrated circuit changes the length of the high period of the corrected clock 'clk_crt' to become larger in the low frequency region and changes the length of the high period of the corrected clock 'clk_crt' to become smaller in the high frequency region. As described above, the semiconductor integrated circuit according to an embodiment selects any one of a plurality of operation frequency regions and implement an operation of correcting the duty cycle which is adaptable to the selected frequency region.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor integrated circuit comprising:
 a frequency determining unit configured to determine an operational speed of the semiconductor integrated circuit and to generate a frequency region signal;
 a duty cycle control unit configured to detect a duty cycle of a DLL clock and to generate a duty cycle control signal;
 a duty cycle correcting unit configured to generate a corrected clock by correcting a duty cycle of an input clock in response to the frequency region signal and in response to the duty cycle control signal; and a DLL (Delay Locked Loop) circuit configured to generate the DLL clock by controlling a phase of the corrected clock.

2. The semiconductor integrated circuit according to claim 1, wherein the frequency determining unit is configured to select any one frequency region among a plurality of predetermined frequency regions by determining a frequency of the input clock, and configured to generate the frequency region signal.

3. The semiconductor integrated circuit according to claim 2, wherein the frequency determining unit includes:

a pulse generator configured to divide the frequency of the input clock and to generate a divided pulse signal using the frequency-divided clock;

a digital converter configured to sequentially delay the divided pulse signal and to generate a multiple-bit delay code by comparing phases of the delayed signals with the input clock;

an error detection corrector configured to generate a multiple-bit correction code by performing error detection and correction operations for the multiple-bit delay code;

an encoder configured to generate a multiple-bit encoding signal by encoding the multiple-bit correction code; and a decoder configured to generate the frequency region signal by decoding the multiple-bit encoding signal.

4. The semiconductor integrated circuit according to claim 3, wherein the pulse generator is configured to divide the frequency of the input clock by two and to output only one period of the divided clock as the divided pulse signal.

5. The semiconductor integrated circuit according to claim 3, wherein the digital converter is configured to delay the divided pulse signal using a plurality of delayers connected in series, and configured to generate the multiple-bit delay code using a plurality of phase comparators that compare phases of the signals delayed by the delayers with the input clock, respectively.

6. The semiconductor integrated circuit according to claim 3, wherein the error detection corrector is implemented by a bubble error corrector and configured to generate the multiple-bit correction code by extracting a point where the logic values of the bits in the multiple-bit delay code are continuously at a predetermined value and then re-configuring a multiple-bit of code value.

7. The semiconductor integrated circuit according to claim 3, wherein the encoder is configured to generate the multiple-bit of encoding signal having a logic value that depends on that logic value of the multiple-bit of correction code that pertains to which range of predetermined frequency region.

8. The semiconductor integrated circuit according to claim 1, wherein the duty cycle control unit is configured to detect the duty cycle of the DLL clock, to generate a multiple-bit of digital signal corresponding to the detection result, to generate first and second bias currents in response to the multiple-bit of digital signal, and to output the first and second bias current as the duty cycle control signal.

9. The semiconductor integrated circuit according to claim 8, wherein the duty cycle control unit includes:

a duty cycle detector configured to detect the duty cycle of the DLL clock and generate a detection signal;

a counter configured to generate a multiple-bit counting signal by performing a counting operation in response to the detection signal; and a current source configured to generate the first and second bias currents in response to the multiple-bit of counting signal, and to output the bias currents as the duty cycle control signal.

10. The semiconductor integrated circuit according to claim 9, wherein the current source includes:

a first node;

a second node;

a first current controller configured to control the amount of current of the first node in response to a supply current and the multiple-bit of counting signal;

a second current controller configured to control the amount of current of the second node in response to the supply current; and a current generator configured to control the amount of current of the duty cycle control signal in accordance to the amount of current of the first node and to the amount of current of the second node.

11. The semiconductor integrated circuit according to claim 1, wherein the duty cycle correcting unit is configured to operate in a frequency region corresponding to the frequency region signals.

12. The semiconductor integrated circuit according to claim 11, wherein the duty cycle correcting unit includes:

a first node;

a second node;

a clock input section configured to control the voltage of the first node and the voltage of the second node in response to the input clock;

a first voltage controller configured to control the voltage of the first node in accordance to control of the frequency region signal and to the duty cycle control signal;

a second voltage controller configured to control the voltage of the second node in accordance to the frequency region signal and to the duty cycle control signal; and a corrected clock generator configured to generate the corrected clock in response to the voltage levels of the first node and the second node.

13. A semiconductor integrated circuit comprising:

a frequency determining unit configured to generate a frequency region signal by determining a frequency of an input clock;

a duty cycle control unit, in response to the logic value of the multiple-bit digital signal, configured to generate a multiple-bit digital signal by detecting a duty cycle of a DLL clock, and configured to generate a first bias current having a variable current and configured to generate a second bias current having a substantially fixed current;

a duty cycle correcting unit configured to operate in a frequency region corresponding to the frequency region signal, configured to adjust the voltage levels of a first node and a second node in accordance to the amount of current of the first bias current and the amount of current of the second bias current, and configured to generate a corrected clock by correcting a duty cycle of the input clock in accordance to the voltage levels of the first node and the second node; and a DLL (Delay Locked Loop) circuit configured to generate the DLL clock by controlling a phase of the corrected clock.

14. The semiconductor integrated circuit according to claim 13, wherein the frequency determining unit includes:

a pulse generator configured to divide the frequency of the input clock and to generate a divided pulse signal using the frequency-divided clock;

a digital converter configured to sequentially delay the divided pulse signal and to generate a multiple-bit delay code by comparing phases of the delayed signals with the input clock;

an error detection corrector configured to generate a multiple-bit correction code by performing error detection and correction operation for the multiple-bit delay code;

an encoder configured to generate a multiple-bit encoding signal by encoding the multiple-bit correction code; and a decoder configured to generate the frequency region signal by decoding the multiple-bit encoding signal.

15. The semiconductor integrated circuit according to claim 13, wherein the duty cycle control unit includes:
a duty cycle detector configured to detect the duty cycle of the DLL clock and to generate a detection signal;
a counter, in response to the detection signal, configured to generate a multiple-bit counting signal by performing a counting operation; and
a current source configured to generate first and second bias currents in response to the multiple-bit of counting signal.

16. The semiconductor integrated circuit according to claim 15, wherein the current source includes:
a third node;
a fourth node;
a first current controller, in response to a supply current and the multiple-bit of counting signal, configured to control the amount of current of the third node;
a second current controller, in response to the supply current, configured to control the amount of current of the fourth node; and
a current generator configured to control the amount of first and second bias currents in accordance to the amount of current of the third node and the amount of current of the fourth node.

17. The semiconductor integrated circuit according to claim 13, wherein the duty cycle correcting unit includes:
a clock input section, in response to the input clock, configured to control the voltage of the first node and to control the voltage of the second node;
a first voltage controller configured to control the voltage of the first node in accordance to the frequency region signal and to the first bias current;
a second voltage controller configured to control the voltage of the second node in according to the frequency region signal and the second bias current; and
a corrected clock generator configured to generate the corrected clock in response to the voltage levels of the first node and the second node.

* * * * *